United States Patent
Yang et al.

[11] Patent Number: 5,880,013
[45] Date of Patent: Mar. 9, 1999

[54] METHOD FOR REDUCING CROSS-CONTAMINATION IN ION IMPLANTATION

[75] Inventors: Chien-Jung Yang, I-Lan; Ming-Tsung Lee, Taipei, both of Taiwan

[73] Assignee: United Microelectronics Corporation, Hsin-Chu, Taiwan

[21] Appl. No.: 814,378

[22] Filed: Mar. 11, 1997

Related U.S. Application Data

[60] Provisional application No. 60/035,211, Jan. 10, 1997.
[51] Int. Cl.$^6$ .................................................. H01L 21/425
[52] U.S. Cl. ............................................ 438/514; 438/909
[58] Field of Search .................................. 438/510, 514, 438/905, 907, 909

[56] References Cited

U.S. PATENT DOCUMENTS 5,354,698 10/1994 Cathey, Jr. ............................... 438/514
5,602,045 2/1997 Kimura ................................... 438/909

*Primary Examiner*—Chandra Chaudhari
*Attorney, Agent, or Firm*—Rabin & Champagne P.C.

[57] ABSTRACT

This ion implantation method reduces the observed levels of cross-contamination and reduces the level of variations in surface conductivity related to the provision of multiple ion implantations into a semiconductor wafer. Reduced levels of cross-contamination are obtained by purging the implantation chamber and then evacuating the implantation chamber before beginning an implantation process. This purge and evacuation cycle is believed to be particularly effective in reducing cross-contamination when two implantations are made consecutively into a wafer without removing the wafer from the implantation chamber or when successive wafers are transported into the ion implantation chamber and implantations are made into each successive wafer.

9 Claims, 4 Drawing Sheets

METHOD FOR REDUCING CROSS-CONTAMINATION IN ION IMPLANTATION

This application claims priority from provisional application Ser. No. 60/035,211, filed Jan. 10, 1997.

BACKGROUND OF THE INVENTION

1. Field of the Invention

The present invention relates to the formation of integrated circuit devices and, more particularly, to the formation of integrated circuit devices using ion implantation processes that exhibit reduced levels of cross-contamination.

2. Description of the Related Art

Doping of high density integrated circuit devices is accomplished by ion implantation for a variety of reasons. Among the more important characteristics of ion implantation are the ready availability of masking techniques for controlling the lateral extent of the doped region formed by the implantation, the ability to control implantation dosages and energies, and the relatively high speed of the implantation process. These desirable characteristics make ion implantation a more manufacturable process than other doping techniques in most applications. Ion implantation is commonly used for forming P-type or N-type isolation wells, FET source/drain regions, channel stop implantations, threshold adjust implantations, anti-punchthrough implantations, and other laterally defined doped regions. It is difficult to achieve the desired levels of lateral definition using processes other than ion implantation. Because of its comparatively low cost and flexibility, ion implantation is also utilized when other doping techniques could be used. For example, ion implantation is commonly used in creating doped surface layers on entire wafers that have either a conductivity type different than the rest of the wafer or that have a doping level that is higher than the concentration of the rest of the wafer. Although diffusion could readily be used for this application, ion implantation is generally preferred.

Ion implantation has certain drawbacks for the manufacture of integrated circuit devices, however. Of present concern is the fact that ion implantation can introduce a variety of contaminants into the region being implanted. Highly excited ions are typically present within the ion implanter and the highly excited ions are incident on surfaces within the implanter other than the surface of the workpiece being implanted. Affected surfaces of the implanter include, for example, the shutter that separates the ion beam line from the ion implantation chamber and the clips that hold the workpiece in place during the implantation process. In the past, both the shutter and the workpiece clips have had metal surfaces so that the incident beam of implantation ions would sputter metal atoms from their surfaces that could be deposited onto the surface of the workpiece or even be implanted into the workpiece. Such metallic contamination is undesirable and steps have been taken to eliminate this contamination mechanism, such as coating the shutters and the clips with an inert or non-metallic, non-sputterable material. These efforts have reduced the level of metallic contamination observed in modem ion implantation systems, although this contamination source continues to be of concern.

There are other contamination mechanisms that act in ion implantation processes. Studies have suggested that one of the most important contamination mechanisms in ion implantation is cross-contamination. Cross-contamination occurs in different ways, but a common mechanism is for a first type of dopant ion to be implanted into a first workpiece during a first implantation process. During this first implantation process, dopant ions of the first type are implanted into the ion beam line, into the shutters and other apertures, into the workpiece supports, and other portions of the implantation chamber. In a second, subsequent implantation process utilizing dopant ions of a second type, the second dopant ions are incident on all of the surfaces of the implanter into which the first dopant ions were implanted in the first implantation process. The first dopant ions can be sputtered from the surfaces of the implanter and may be accelerated by collisions with the second dopant ions to an implantation energy. Consequently, a fraction of first type dopant ions may be deposited on the surface of the second workpiece or may be implanted into the second workpiece during the implantation of the second type dopant ions. This contamination process can affect the uniformity of dopants over the surface of a workpiece to a significant extent. For example, the variations in dopant concentrations can be sufficiently large to produce measurable variations in the surface conductivity of the implanted wafer. The levels of reported variations in surface conductivity may be on the order of less than one percent up to as much as ten percent. Another effect of cross-contamination is variation in junction depth. Earlier implanted ions can be sputtered from the surfaces of the implanter and can be implanted into contact regions, isolation wells, or other junctions. If the earlier, contaminant dopant ion is a comparatively light, rapidly diffusing species and the second, intended dopant is a comparatively heavy, slowly diffusing species, an activation anneal could cause the earlier, contaminant dopant to diffuse rapidly through the junction region created by the second dopant ion. The activation anneal causes the more rapidly diffusing (earlier) dopant to extend deeper into the substrate than the junction created by the implantation of the desired second dopants in a manner that may alter the electrical characteristics of the junction and may create a more graded junction than is desired.

These and other effects associated with cross-contamination can significantly harm the performance of the integrated circuit devices manufactured using ion implantation processes. Moreover, the above-described cross-contamination processes are not limited to successive implantations within an implanter. Reports indicate that exposed surfaces within implanters become saturated with implanted ions after only a short period of use. There are accordingly always impurity ions within the exposed surfaces of the implanter which could be sputtered from the exposed surfaces and which could be implanted into a workpiece in a cross-contamination process. Some of the problems associated with cross-contamination might be reduced if only a single dopant impurity were used in a particular piece of implantation equipment. Even if such a solution were practical, however, it may not provide satisfactory results. It would be expected that a single species implanter would exhibit improved performance with respect to junction depth variations. No comparable improvement would be expected for the two-dimensional uniformity of dopant concentration.

SUMMARY OF THE PREFERRED EMBODIMENTS

It is therefore an object of this invention to reduce the level of cross-contamination that occurs in ion implantation processes.

One aspect of the present invention provides a method of implanting a workpiece including the following steps performed in order, beginning by providing a workpiece to an ion implantation chamber and providing a first pressure below atmospheric pressure within the ion implantation chamber. Next a flow of gas is provided to the ion implantation chamber while the workpiece is within the ion implantation chamber to provide a second pressure within the ion implantation chamber above the first pressure. The method continues by evacuating the ion implantation chamber to a third pressure lower than the second pressure, the third pressure being appropriate to an ion implantation process. Ions are then implanted into the workpiece.

A particularly preferred embodiment of this aspect of the invention includes a step of cleaning a surface of the workpiece using argon ions prior to the step of providing a flow of gas to the ion implantation chamber.

Another particularly preferred embodiment of this aspect of the invention includes a step of removing a previously implanted workpiece from the ion implantation chamber prior to the step of providing the workpiece to the ion implantation chamber while the ion implantation chamber is maintained at the first pressure.

DETAILED DESCRIPTION OF THE PREFERRED EMBODIMENTS

Preferred embodiments of the present invention provide an ion implantation method that exhibits reduced levels of cross-contamination, reducing the impact that the prior implantation and cleaning history of an implanter has on subsequent implantation processes. As will be described in greater detail below, reduced levels of cross-contamination are achieved in some preferred embodiments of the invention by introducing a vent or purge of the implantation chamber followed by an evacuation of the implantation chamber prior to performing an ion implantation into a workpiece within the implantation chamber. The process cycle consisting of a vent or purge of the implantation chamber followed by an evacuation of the implantation chamber improves cross-contamination performance when performed a single time and improves performance more when performed multiple times prior to performing an ion implantation into the workpiece. This process cycle of a vent or purge followed by an evacuation might be performed for a process which includes a single implantation step or multiple cycles might be performed in a process which includes the implantation of two different types of ions consecutively into a single workpiece. Such two implantation processes include some variations of a threshold adjust implantation used in manufacturing field effect transistors (FETs) and doubly diffused drain processes also used in the manufacture of FETs. When used in either embodiment, it is particularly preferred that a vent and evacuate cycle be performed after an argon ion clean of the surface of the workpiece but before the first ion implantation process. Those of ordinary skill in the art will appreciate that provision of the vent or purge followed by evacuation cycle is contrary to conventional ion implantation practices in which throughput is improved by not venting the ion implantation chamber between successive implantations to a single workpiece and by not venting the ion implantation chamber after the workpiece is cleaned.

The invention described herein has been implemented within a conventional ion implantation system, the commercially available NV-GSD200 manufactured by Eaton Semiconductor Equipment. The present invention could be readily implemented in other commercially available or presently contemplated implantation systems either immediately or after certain modifications to the equipment are made that are well within the capabilities of those of ordinary skill in the art. As such, and in the interest of providing a concise description of the present invention, a detailed description of ion implantation and ion implantation equipment is not provided herein.

Figure 1:
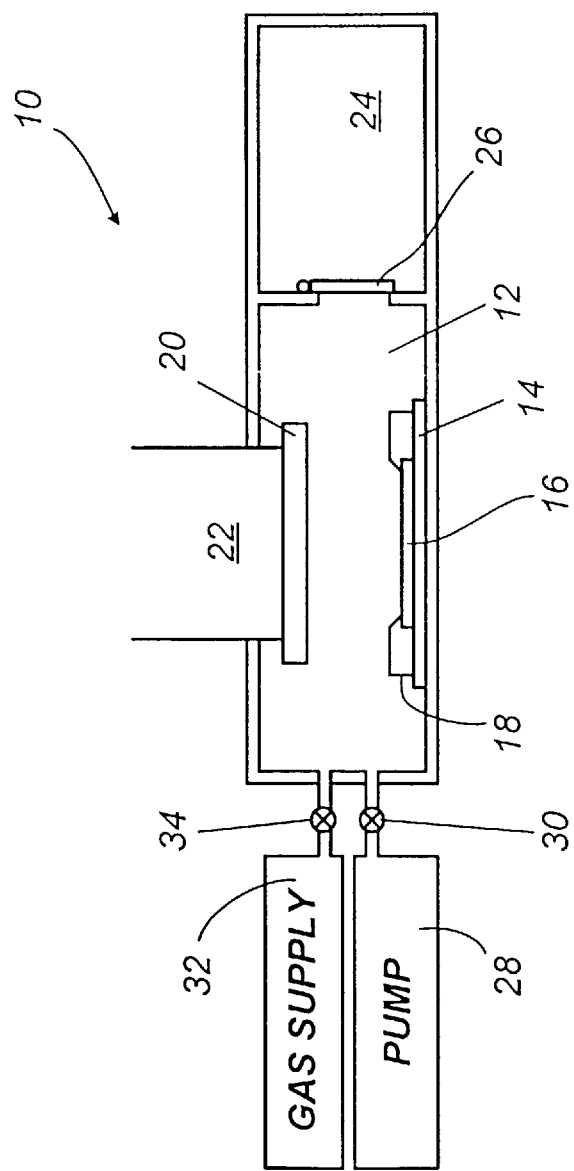
FIG. 1 is a schematic representation of a portion of an implanter.
Figure 2:
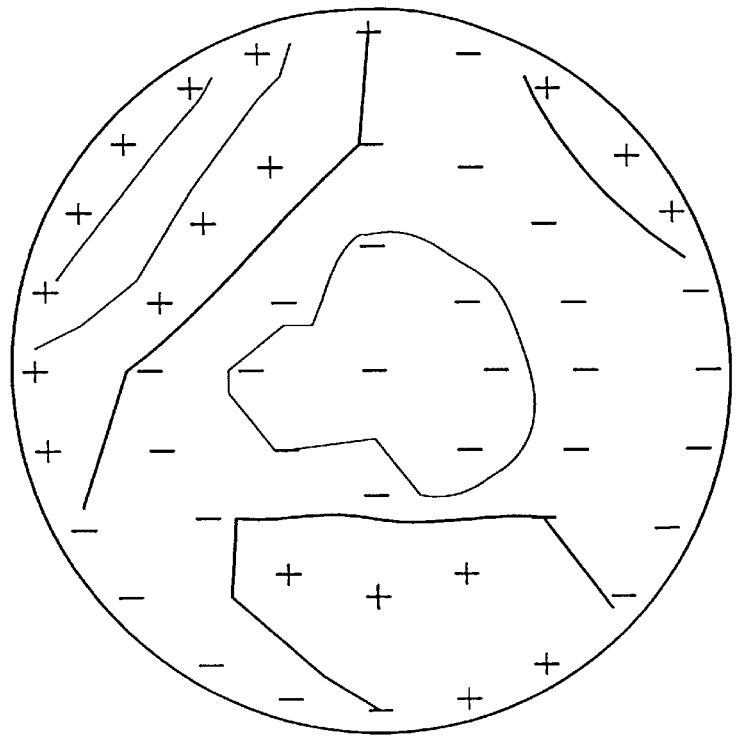
FIGS. 2 and 3 illustrate relative uniformities achieved using two different processes for implanting boron fluoride into a silicon wafer, as reflected in surface resistivity measurements.
Figure 3:
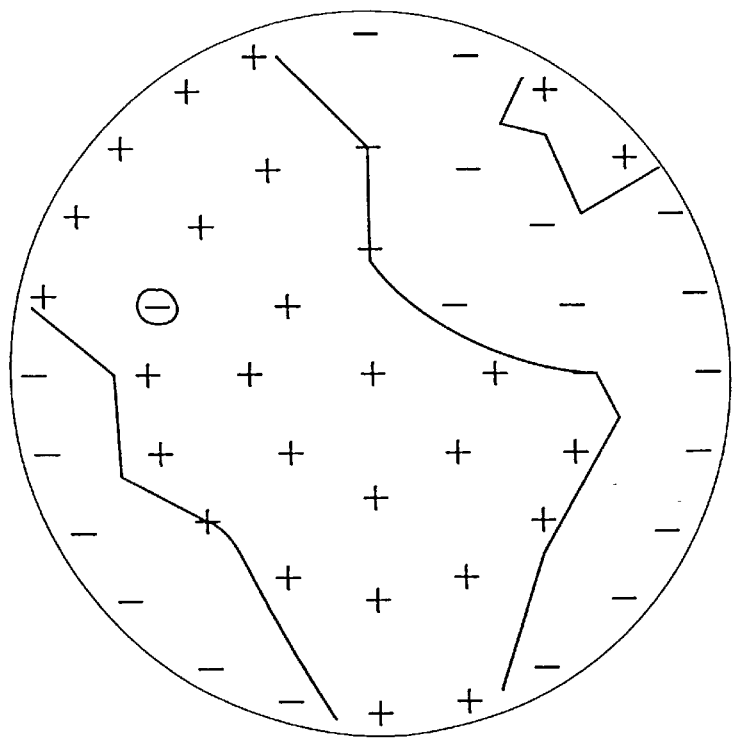
Figure 4:
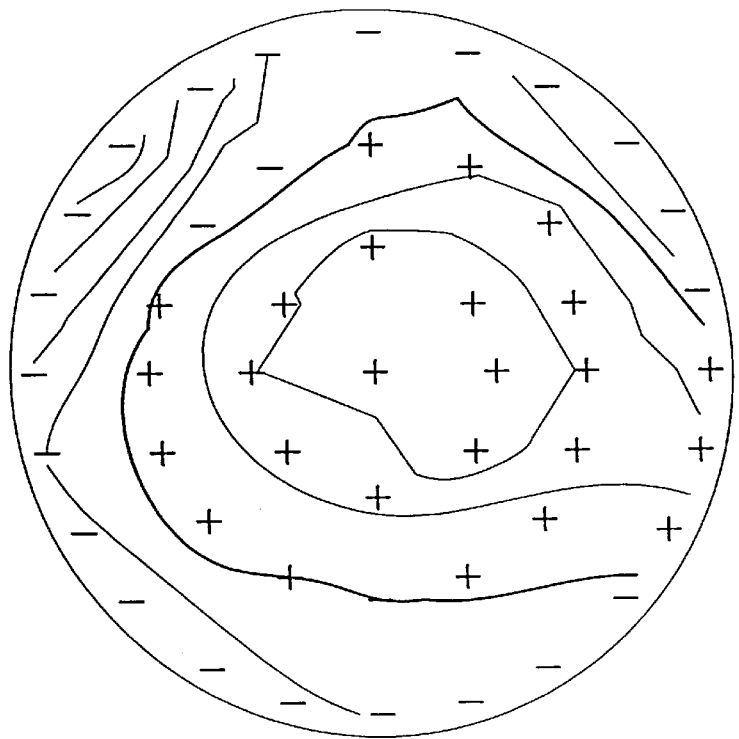
FIGS. 4 and 5 illustrate relative uniformities achieved using two different processes for implanting arsenic into a silicon wafer, as reflected in surface resistivity measurements.
Figure 5:
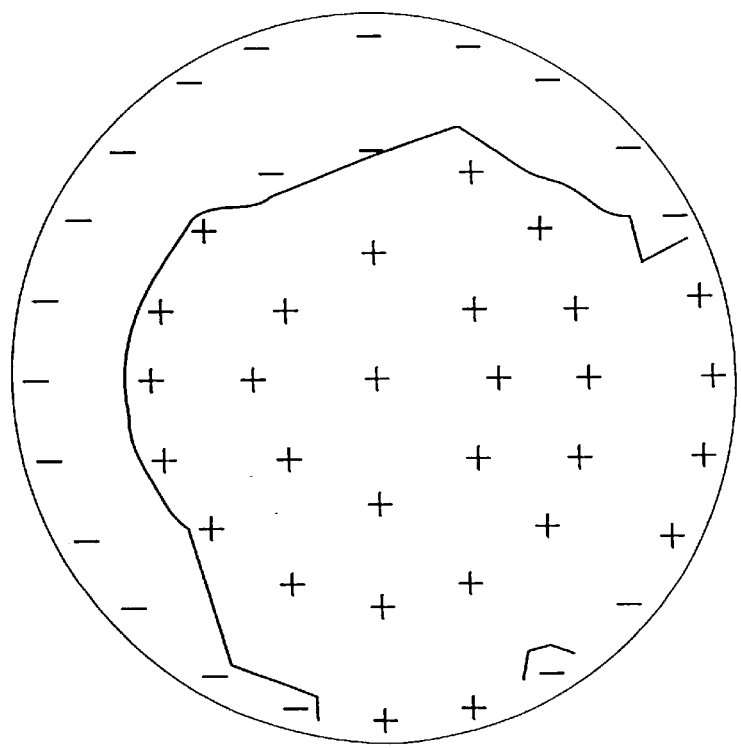
Figure 6:
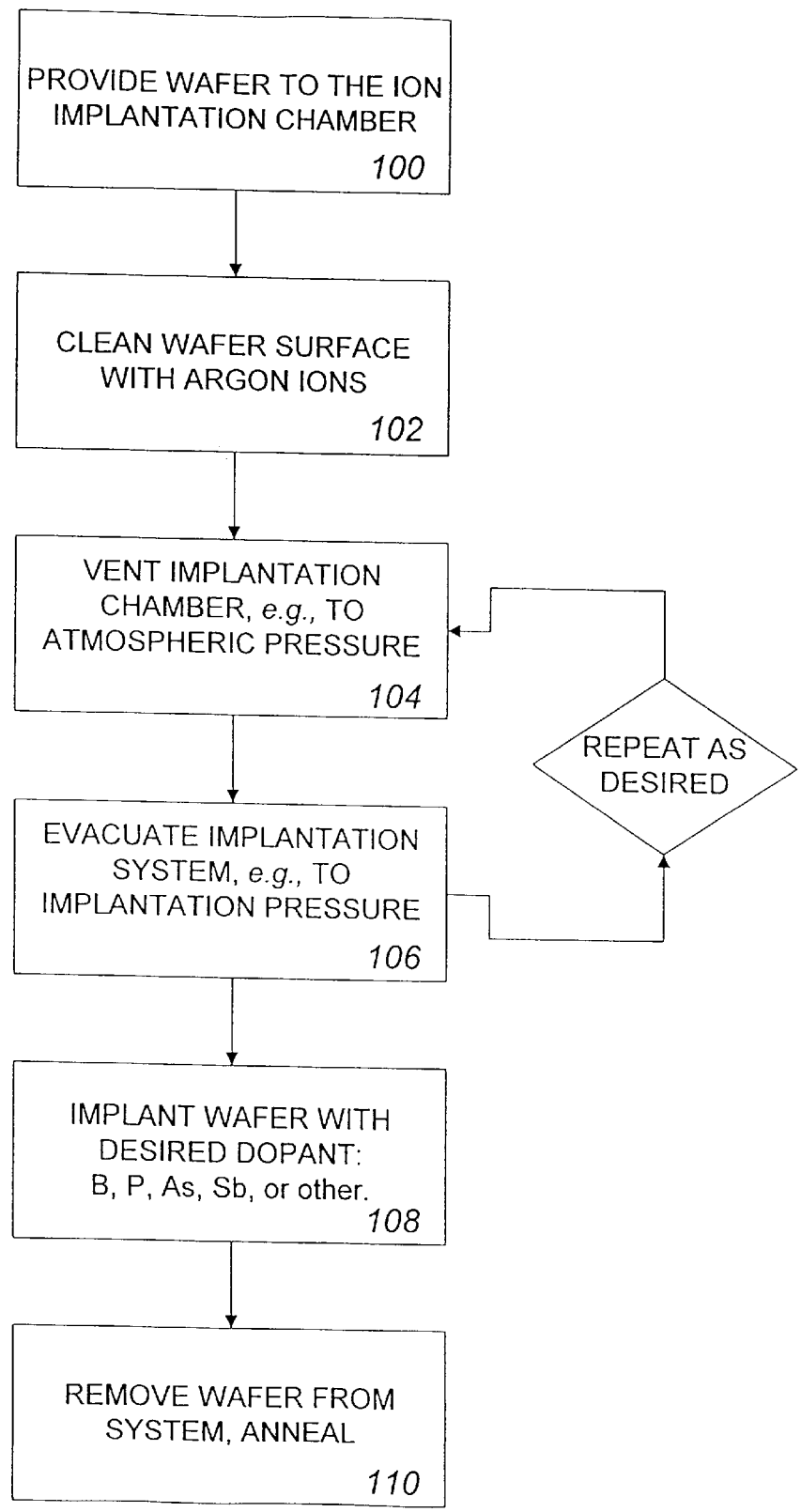
FIG. 6 is a flow chart of an implantation process in accordance with the present invention.

FIG. 1 shows, in a highly schematic and distorted representation, an ion implantation system which is illustrative of the type of ion implantation system that may be used in practicing the present invention. The ion implantation system 10 includes an ion implantation chamber 12 that encloses a fixture 14 on which a workpiece 16 is held during an ion implantation process. The workpiece 16 is held against the surface of the fixture 14 by clips 18 or by means of other of the well known mounting technologies. It is, for example, possible to hold the workpiece in place using a vacuum chuck or an electrostatic chuck where no portion of the holding apparatus is present in front of the wafer. Even in systems that do not include clips 18, other surfaces are present within the ion implantation chamber 12, and within the ion implantation system as a whole, that can mediate cross-contamination mechanisms. It should be noted that, although the present invention is described in terms of its use in the implantation of ions into a silicon wafer, other workpieces might also be implanted using embodiments of the present invention. For example, the present invention might be used in the implantation of impurities into the amorphous or polycrystalline silicon layers formed above glass or quartz substrates in the manufacture of flat panel (e.g., LCD) displays.

The fixture 14 holds the workpiece 16 adjacent a port or shutter 20 that separates the ion implantation chamber from the beam line 22. Typically, ions are generated, accelerated and then directed through the beam line toward the workpiece. Magnetic steering may be used to control the path of the accelerated ions and to energy select the ions that are to be implanted into the workpiece. Regardless of the collimation and steering of the ions, some of the ions in the beam will be incident on the walls of the beam line 22, the shutter 20, the clips 18, exposed surfaces of the fixture 14, and other exposed surfaces within the ion implantation system. At least some of the ions which are incident on the surfaces exposed within the ion implantation system are embedded within these surfaces and so are available for cross-contamination of the sort discussed above in the background of this specification.

Another source of contaminant ions that can participate in cross-contamination of a workpiece are at the surface of the workpiece itself. Most, if not all, of the workpieces into which ions are implanted already have ions present within them. When ions are implanted into such a doped workpiece, dopants or other contaminants at the surface of the workpiece can be recoil implanted into the workpiece to a depth similar to the depth obtained by the primary, desired implantation. In most instances, this recoil implantation mechanism is believed to be of lesser importance in comparison with the cross-contamination produced by contaminant ions sputtered from the other exposed surfaces within the ion implantation system.

The illustrated ion implantation system includes a buffer chamber 24, separated from the ion implantation chamber 12 by a gate valve 26, into which wafers are provided from outside of the system to be transported into the ion implantation chamber 12. Preferred aspects of the present invention include a vacuum pump 28 that communicates with the ion implantation chamber 12 through a valve 30 which may be used for evacuating the ion implantation chamber 12. In particularly preferred embodiments, a gas supply 32 is provided that communicates with the ion implantation chamber through a valve 34. Although it is possible to simply vent the ion implantation chamber to atmosphere when practicing less preferred embodiments of the invention, it is generally preferable to utilize a readily available and sufficiently inert gas such as nitrogen or argon as the purge or vent gas within the gas supply 32. Preferably, the valves 30, 34 and other functions of the pump 28 and gas supply 32 operate under computer control for the full automation of the repeated purge or vent followed by evacuation cycles preferably used in the present invention.

In operation, wafers are provided to the implantation system 10 through the buffer chamber 24, with the wafers typically being transported within wafer carriers by automated transport mechanisms or carrier transport robots. A wafer carrier (not shown) is loaded into the buffer chamber 24 and then the chamber 12 is typically evacuated to a pressure that may, for example, be equal to the pressure within the ion implantation chamber during implantation. It is possible that wafers prepared for ion implantation could be held at atmospheric pressure within the buffer chamber, but it is typically more convenient for the wafers to be held at a pressure that is consistent with the implantation of ions. When the buffer chamber 24 has reached a pressure appropriate to the transfer of wafers between chambers, gate valve 26 is opened and a wafer transport robot moves a wafer from the buffer chamber onto the fixture 14.

Conventionally, throughput through the ion implantation system is maximized by holding both the ion implantation chamber 12 and the buffer chamber 24 at a pressure appropriate to the implantation of ions into the workpiece.

A central aspect of a vent and evacuation cycle like that preferred in the present invention is the dilution of the concentration of contaminant ions. If contaminant ions are present within the implantation chamber in a gaseous or particulate form, a vent and evacuation cycle will greatly dilute the concentration of contaminant ions present in gaseous form. For example, when the chamber is vented to atmospheric pressure followed by a rough evacuation to about 1 milliTorr, the relative concentration of contaminant ions present as gas within the chamber may theoretically be reduced by a factor of almost $10^6$. Accordingly, there is no need to pull a high vacuum to obtain the benefits of the present invention. In the Eaton implantation system identified above, the level of evacuation used in evaluating the present invention consisted of approximately one minute's pumping using the rough pump for the system. Repeated vent and evacuation cycles can further reduce the concentration of contaminant ions, if greater uniformity is desired in the implanted workpieces. As a practical matter, the levels of dilution theoretically estimated may not be obtained in practice, but it is clear that significant reductions in contaminant ions are obtained through practice of this method.

What is claimed:

1. A method of implanting ions into a workpiece, comprising the following steps performed in sequence:

providing a workpiece to an ion implantation chamber and providing a first pressure below atmospheric pressure within the ion implantation chamber;

providing a flow of gas into the ion implantation chamber while the workpiece is within the ion implantation chamber to provide a second pressure within the ion implantation chamber above the first pressure;

evacuating the ion implantation chamber to a third pressure lower than the second pressure, the third pressure being appropriate to an ion implantation process; and implanting ions into the workpiece.

2. The method of claim 1, wherein the third pressure is the same as the first pressure.

3. The method of claim 1, wherein the third pressure is about $10^{-5}$ milliTorr.

4. The method of claim 1, further comprising the additional steps performed in order before the step of implanting ions:

providing a flow of gas into the ion implantation chamber while the workpiece is within the ion implantation chamber to provide a fourth pressure within the ion implantation chamber above the first pressure; and evacuating the ion implantation chamber to a fifth pressure lower than the fourth pressure.

5. The method of claim 4, further comprising the additional steps performed in order before the step of implanting ions:

providing a flow of gas into the ion implantation chamber while the workpiece is within the ion implantation chamber to provide a sixth pressure within the ion implantation chamber above the first pressure; and evacuating the ion implantation chamber to a seventh pressure lower than the sixth pressure.

6. The method of claim 1, wherein the flow of gas comprises nitrogen or argon.

7. The method of claim 1, further comprising a step of cleaning a surface of the workpiece using argon ions prior to the step of providing a flow of gas to the ion implantation chamber.

8. The method of claim 7, wherein the workpiece is a silicon wafer and wherein the ions comprise a species chosen from the group consisting of boron, phosphorus, arsenic or antimony.

9. The method of claim 1, further comprising a step of removing a previously implanted workpiece from the ion implantation chamber prior to the step of providing the workpiece to the ion implantation chamber while the ion implantation chamber is maintained at the first pressure.

\* \* \* \* \*